US005329533A

United States Patent [19]
Lin

[11] Patent Number: 5,329,533
[45] Date of Patent: Jul. 12, 1994

[54] PARTIAL-SCAN BUILT-IN SELF-TEST TECHNIQUE

[75] Inventor: Chih-Jen Lin, Lawrenceville, N.J.

[73] Assignee: AT&T Bell Laboratories, Murray Hill, N.J.

[21] Appl. No.: 813,521

[22] Filed: Dec. 26, 1991

[51] Int. Cl.[5] .............................................. G01R 31/28
[52] U.S. Cl. .................................... 371/22.3; 371/22.5
[58] Field of Search ............................. 371/22.3, 22.5; 324/158 R

[56] References Cited

U.S. PATENT DOCUMENTS 4,534,028  8/1965  Trischler ........................... 371/22.3
5,132,974  7/1992  Rosales ............................. 371/22.3

Primary Examiner—Charles E. Atkinson
Attorney, Agent, or Firm—Robert B. Levy

[57] ABSTRACT

Testing of an integrated circuit (10), configured of a plurality of flip-flops ($14_1$–$14_n$), at least a portion of which are arranged in a scan chain ($16_1$–$16_k$), is carried out by replacing each self-looping, non-scan chain flip-flop ($14_6$) with an initializable non-scan flip-flop (64). The integrated circuit (10), including each initializable flip-flop (64) therein, is then initialized prior to placing the integrated circuit in a non-operational mode. During the non-operational mode, a first test vector is shifted through the scan chain flip-flops, causing each to shift out a bit previously latched therein. The integrated circuit (10) is then returned to an operational mode, after which time, a second test vector is applied to its inputs, causing a response to appear at its outputs, and also causing a bit to be shifted into each scan chain flip-flop. The response of the integrated circuit is compacted with the bits shifted from the scan chain flip-flops. By repeating this process for a predetermined number of cycles, a very high indication of the faults in the circuit can be had.

11 Claims, 4 Drawing Sheets

PARTIAL-SCAN BUILT-IN SELF-TEST TECHNIQUE

TECHNICAL FIELD

This invention relates generally to a technique for testing an integrated circuit.

BACKGROUND OF THE INVENTION

Digital integrated circuits are usually comprised of a large number of individual circuit elements which may be combinational in nature, such as a gate, or sequential in nature, such as a flip-flop. The testing of both the combinational and sequential circuit elements in an integrated circuit is performed by generating a pattern of test vectors and successively applying the vectors to the integrated circuit inputs. Depending on the pattern of the test vectors which are applied, the responses of the integrated circuit to the vectors can provide a very accurate indication of the faults that may be present.

Test vector selection, often referred to as test pattern generation, is a straightforward task for combinational circuit elements. However, for sequential circuit elements, test pattern generation is far more complex because of the need to propagate known values from element to element over time. To simplify the task of testing an integrated circuit containing a large number of sequential elements, there has been developed a technique known as "partial-scan testing" which is disclosed in U.S. Pat. No. 5,043,986, issued on Aug. 27, 1991, to V. D. Agrawal et al., and assigned to AT&T Bell Laboratories, the present assignee. As disclosed in that patent, partial-scan testing of an integrated circuit is practiced by first isolating a selected set of memory elements (e.g., flip-flops) within the integrated circuit and then coupling such elements in a chain. Each of the memory elements is chosen such that while the integrated circuit is in a test mode, substantially all feedback paths from an output of a chosen memory element to its input are less than a selected cycle length defined by the number of memory elements in the chain.

While in the test mode, test data is scanned into the chain of selected memory elements of the integrated circuit. Once the test data is entered, the integrated circuit is returned to a non-test mode so that the selected memory elements can respond to the previously-received test data in their usual manner. After a certain period of time, the test mode is re-entered, and the response of the selected memory elements is captured for analysis.

The partial-scan technique described in the Agrawal et al. patent can achieve very high fault coverage, even when as few as 10–30% of the memory elements are tested (i.e., scanned) in the manner described. However, partial-scan testing of individual integrated circuits carried by a circuit board is difficult to accomplish at a board level, or at a higher level, such as at a system or field level.

Thus, there is a need for a technique for testing an integrated circuit which allows for high fault coverage and also can be practiced in a built-in self-test mode on a circuit board level and beyond.

SUMMARY OF THE INVENTION

Briefly, in accordance with the invention, a technique is provided for testing an integrated circuit which includes a plurality of flip-flops, a selected group of which (i.e., a set of "scan flip-flops) is arranged in at least one chain for partial-scan testing. The testing technique of the invention is practiced by replacing each self-looping non-scan flip-flop with an initializable (e.g., resettable) flip-flop. A self-looping flip-flop is a non-scan flip-flop whose output is fed back to its input, either directly or through one or more combinational elements, but not through any flip-flops. To begin testing, the integrated circuit is first initialized to a known state and is then placed in a non-operational (test) mode. While the integrated circuit is in the test mode, the bits of a first test vector are scanned out of a first register within the integrated circuit and into the scan flip-flops. At the same time, bits previously stored in the scan flip-flops are shifted out for storage in a second register provided within the integrated circuit.

Once the first test vector bits have been scanned into the scan flip-flops, and the previously stored bits scanned therefrom, the integrated circuit is placed in a normal operating mode. Thereafter, a second test vector is applied to the inputs of the integrated circuit from the first register. In response to the second test vector at the input of the integrated circuit, as well as in response to the first test vector bits shifted into the scan flip-flops, the integrated circuit generates output signals appearing at the output of the non-scan portion of the circuit, while at the same time, bits from the non-scan portion are latched into each of the scan flip-flops. The output signals of the integrated circuit is compacted with the bits previously scanned out of the scan flip-flops. The steps of: (a) scanning the bits of a successive first test vector into the chain of scan flip-flops, (b) applying a successive second test vector to the integrated circuit inputs, and (c) compacting the response of the integrated circuit with the bits previously scanned out of the scan flip-flops are repeated for a predetermined number of cycles. At the end of the predetermined number of cycles, the compacted data is analyzed to determine the faults, if any, in the integrated circuit (including the chain of scan flip-flops).

The test technique of the invention allows for partial-scan testing of an integrated circuit to be effected in a built-in self-test mode to facilitate testing of the multiple integrated circuits at a circuit board level and beyond. Built-in self-test capability is facilitated by replacing each self-looping non-scan flip-flop in the integrated circuit with an initializable flip-flop to allow the integrated circuit to be initialized to a known state.

DETAILED DESCRIPTION

Figure 1:
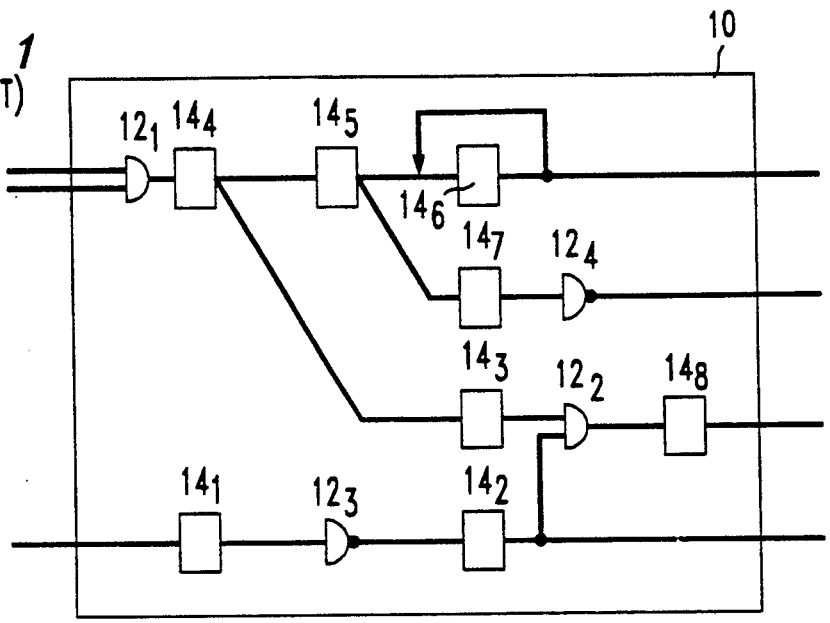
FIG. 1 is a block schematic diagram of an integrated circuit according to the prior art.

Referring to FIG. 1, the present invention is directed to a technique for testing a known integrated circuit 10 comprised of a plurality of combinational elements (i.e., gates) $12_1$, $12_2$, $12_3$ ... $12_m$ and sequential elements (flip-flops) $14_1$, $14_2$, $14_3$ ... $14_n$ where m and n are integers. In the preferred embodiment, m and n are equal to four and eight, respectively, but could be larger or smaller. One or more of the flip-flips, such as the flip-flop $14_6$ for example, may be self-looping; that is, its output may be fed back to its input either directly or through one or more combinational elements (not shown) but never through any flip-flops. The number of combinational and sequential elements $12_1$–$12_m$ and $14_1$–$14_n$, respectively, and the manner in which the elements are interconnected, is dependent on the specific function(s) to be performed by the integrated circuit 10. As will be described, the test technique of the invention is independent of the specific configuration of the integrated circuit 10.

Figure 2:
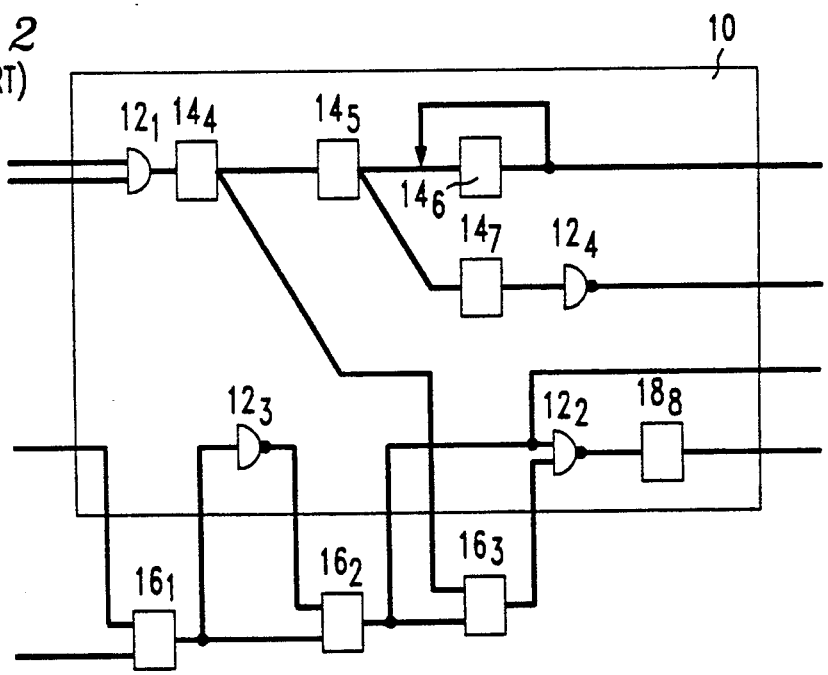
FIG. 2 is a block diagram of the integrated circuit of FIG. 1 depicting how the circuit may be partially scan tested in accordance with the prior art.

Referring to FIG. 2, the integrated circuit 10 can be reconfigured in the manner taught by the aforementioned U.S. Pat. No. 5,043,986 to facilitate partial-scan testing thereof. In the preferred embodiment of FIG. 2, each of a set of scan flip-flops $16_1$, $16_2$ ... $16_k$ has been substituted for a corresponding one of the flip-flops $14_1$, $14_2$ ... $14_k$ of FIG. 1, k being an integer < m and, in the preferred embodiment, k being equal to four. As best seen in FIG. 2, each scan flip-flop, as exemplified by scan flip-flop $16_1$, is comprised of a D-type flip-flop 18 whose D input is supplied with the output signal of a multiplexer 20. The multiplexer 20 is supplied at its first input with a signal DATA, representing the signal ordinarily supplied to input of the flip-flop replaced by the scan flip-flop. The second input of the multiplexer 20 is supplied with a signal SCAN DATA, which comprises a successive bit of a first test vector. The particular one of the two input signals passed by the multiplexer 20 to the flip-flop 18 depends on the state of a control signal SMCN applied to the multiplexer.

Figure 3:
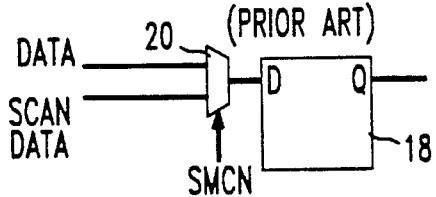
FIG. 3 is a block schematic diagram of a prior-art scan flip-flop within the circuit of FIG. 2.

Referring to FIG. 2, to accomplish scan testing, the scan flip-flops $16_1$–$16_k$ are coupled in at least one chain as indicated. (Note that multiple-scan chains are possible as well.) During actual scan testing, the SMCN signal (see FIG. 3) is asserted and then the bits of the first test vector are sequentially shifted through the chain of scan flip-flops $16_1$–$16_k$ during successive clock cycles. Thereafter, the integrated circuit 10, which had been placed in a non-operational mode as the test vector bits were scanned into the chain of scan flip-flops $16_1$–$16_k$, is now placed in an operational mode so that the circuit responds to the test vector bits. As the integrated circuit 10 responds to test vector bits previously scanned into the scan flip-flops $16_1$–$16_k$, a bit will be scanned into each scan flip-flop from the remaining portion of the integrated circuit. The bits thus shifted into the scan flip-flops $16_1$–$16_k$ during the operating mode are indicative of the operation of the integrated circuit 10, and can thus be shifted out to detect the faults, if any, in the integrated circuit 10.

Figure 4:
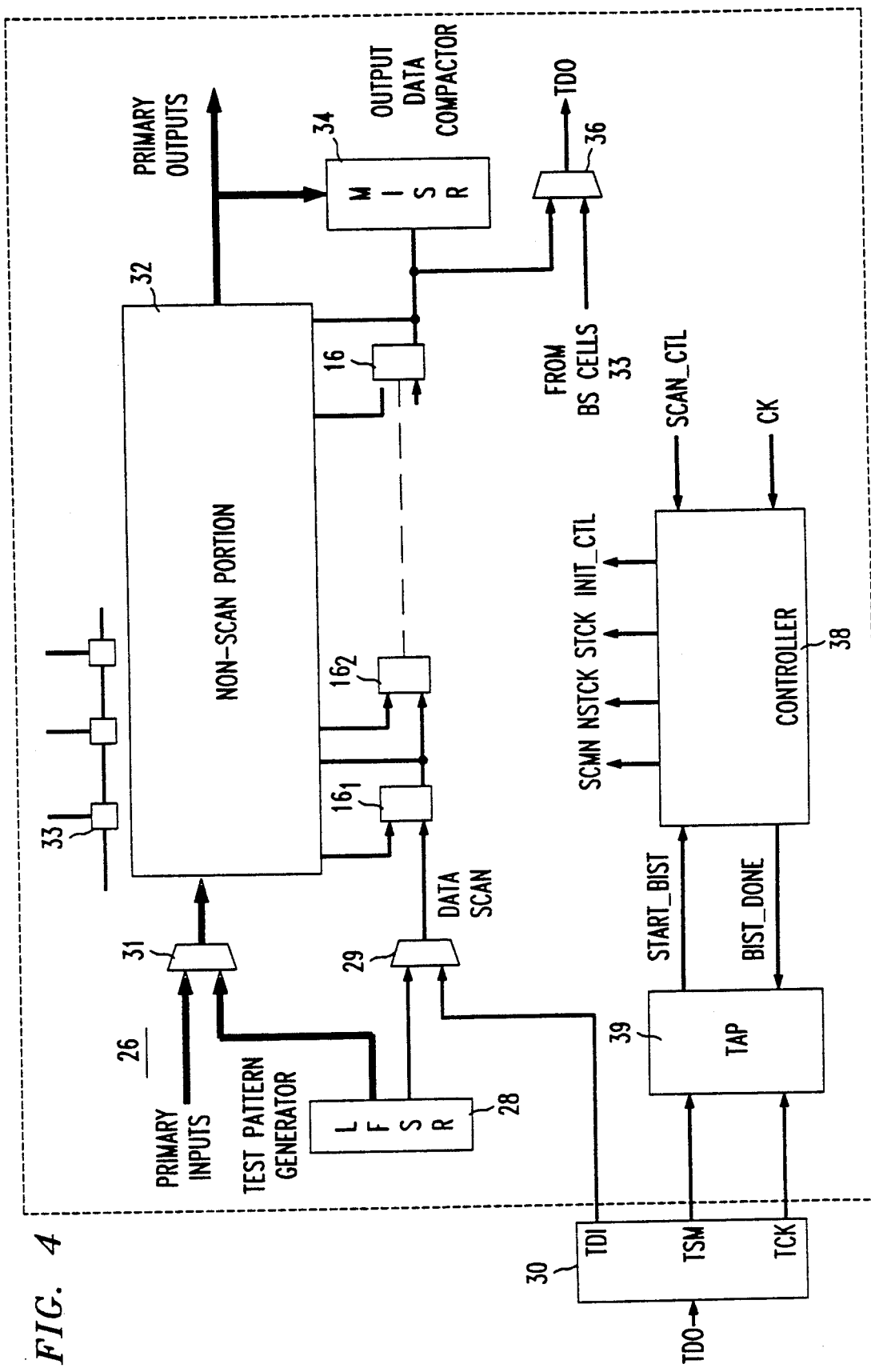
FIG. 4 is a block schematic diagram of a test system, in accordance with the invention, for accomplishing partial-scan testing of the integrated circuit of FIG. 2 in a built-in self-test mode.

While partial-scan testing, accomplished by replacing as few as 10–30% of the flip-flops $14_1$–$14_4$ with a corresponding one of the scan flip-flops $16_1$–$16_k$ in the manner described, affords high fault coverage, the partial-scan test technique is extremely difficult to implement on a circuit board level and beyond. Referring to FIG. 4, there is shown a system 26, which is incorporated within the integrated circuit 10, for accomplishing partial-scan testing of the circuit in a built-in self-test level to facilitate testing on a circuit board level and beyond in accordance with the invention. The system 26 comprises a first storage device 28, in the form of a Linear Feedback Shift Register (LFSR) within the integrated circuit 10, for supplying the SCAN DATA signal (i.e., a first test vector) through a multiplexer 29 to the chain of scan flip-flops $16_1$–$16_k$. The multiplexer 29 serves to multiplex the SCAN DATA supplied from the LFSR 28, with externally supplied test data, typically taking the form of a Test Data Input (TDI) signal from an external boundary scan test system 30 operating in accordance with the IEEE 1149.1 boundary scan test standard.

The LFSR 28 is also coupled through a multiplexer 31 to the primary inputs of the integrated circuit 10 for supplying another test vector to the non-scan portion of the integrated circuit (i.e. the combinational elements $12_1$–$12_m$ and the non-scan flip-flops $14_4$–$14_n$ of FIG. 2). For ease of reference, the non-scan portion of the integrated circuit 10 is represented by the block 32 in FIG. 4. The multiplexer 31 selectively passes either the test vector from the LFSR 28 or the normal operating data to the non-scan portion 32. While depicted as a separate element, the LFSR 28 could actually be reconfigured from a selected group of boundary scan cells 33 provided within the integrated circuit for facilitating boundary scan testing pursuant to the IEEE 1149.1 boundary scan test standard.

The test system 26 also includes a second register 34 provided within the integrated circuit 10, the register taking the form of a Multiple Input Shift Register (MISR) which serves to compact (i.e., logically combine) the output signal of the chain of scan flip-flops $16_1$–$16_k$ and the data produced at the primary outputs of the integrated circuit 10 (as represented by the output of the non-scan portion 32) during testing, as described hereinafter. Like the LFSR 28, the MISR 34 may be reconfigured from a set of the boundary scan cells 33. The output signal of the chain of scan flip-flops $16_1$–$16_k$, which is supplied to the MISR 34, is also supplied to a first input of a multiplexer 36 whose second input is supplied with the output of the chain of boundary scan cells 33. The multiplexer 36 produces an output signal which serves as the Test Data Output (TDO) signal of the integrated circuit 10 for boundary scan testing purposes. The TDO signal is supplied to the external test system 30.

At the heart of the test system 26 is a controller 38 which initiates and controls partial-scan testing of the integrated circuit 10 in a built-in self-test mode in response to a Test Mode Select (TMS) and Test Clock signals supplied from the external test system 30. The TMS and TCK signals are coupled to the controller 38 through a Test Access Port (TAP) 39 within the integrated circuit 10, the TAP being configured in accordance with the IEEE 1149.1 test standards. In response to the TMS signal, the TAP 39 generates a Start BIST signal to cause the controller 38 to initiate testing.

Figure 5:
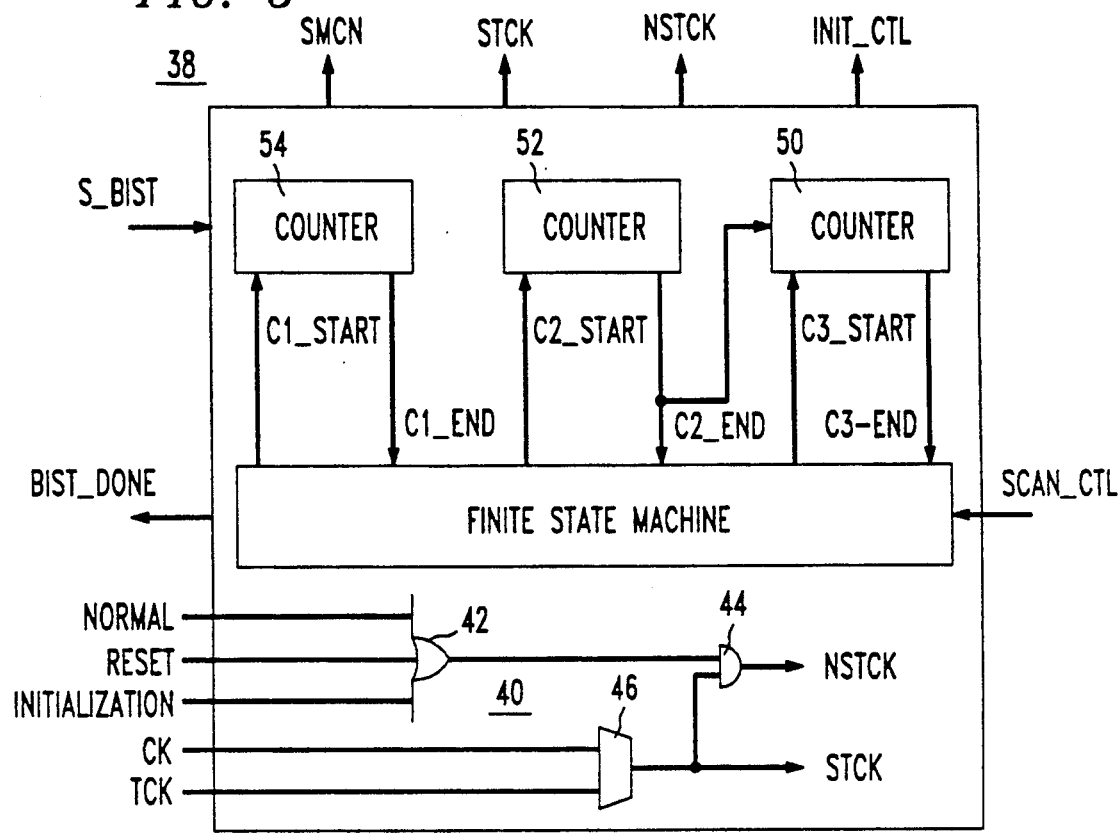
FIG. 5 is a block diagram of a controller embodied within the test system of FIG. 4.

Referring now to FIG. 5, there is shown a block schematic diagram of the controller 38. Within the controller 38 is a clock control circuit 40 which generates a pair of clock signal NSTCK and STCK. The signal NSTCK serves as the clock signal for clocking the non-scan flip-flops $14_4$-$14_n$ of FIG. 2, while the signal STCK serves to clock the scan flip-flops $16_1$-$16_k$ of FIG. 4 as well as the LSFR 28 and MISR 34 of FIG. 4. The clock control circuit 40 of FIG. 5 comprises a three-input OR gate 42 which is supplied at each of its three inputs with a separate one of a set of externally generated signals RESET, NORMAL and INITIALIZATION.

The RESET signal is asserted during the reset of each of the non-scan flip-flops $14_4$-$14_n$. The INITIALIZATION signal is asserted for initialization purposes, as will be discussed in greater detail, while the NORMAL signal is asserted to effectuate normal (non-test) operation of the integrated circuit 10. The output of the OR gate 42 feeds a first input of an AND gate 44. The AND gate 44 has its second input supplied with the output of a multiplexer 46 which is supplied at its first and second inputs with a system clock signal CK, and a Test Clock signal, (TCK), respectively. The system clock signal CK is generated by an operating clock (not shown) external to the integrated circuit 10 while the TCK signal is generated by the external boundary scan test system 30. The output signal produced by the AND gate 44 forms the signal NSTCK for clocking the non-scan flip-flops $14_4$-$14_n$ of FIG. 2 while the output signal of the multiplexer 46 serves as the STCK signal for clocking the scan flip-flops $16_1$-$16_k$ of FIG. 4.

Figure 6:
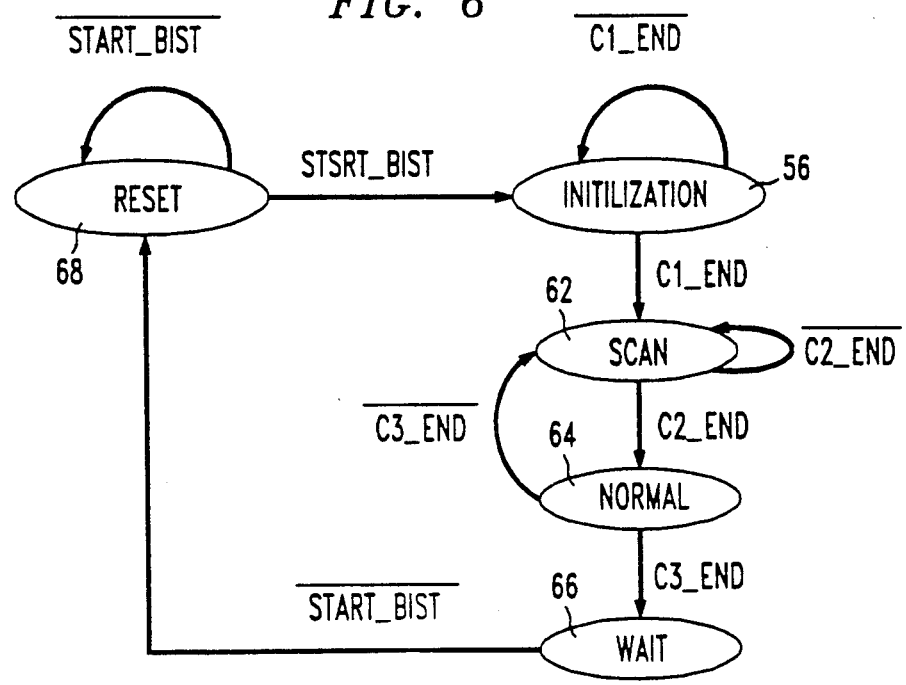
FIG. 6 is a state diagram of a state machine within the controller of FIG. 5.

Within the controller 38 of FIG. 5 is a finite state machine 48 which controls three separate counters 50, 52, and 54 whose signals dictate the sequence of operations. In practice, the finite state machine 48 comprises a five-state machine which may be constructed using well-known techniques. The states of the finite state machine 48 are best illustrated in FIG. 6. As seen in FIG. 6, the state machine 48 of FIG. 5 becomes active to initiate testing during an initialization state (as represented by step 56 in FIG. 6). The initialization state 56 is entered upon receipt by the state machine 48 of the START_BIST signal from the TAP 39 of FIG. 4. During the initialization state 56 of FIG. 6, the counter 54 of FIG. 5 is initialized by a signal C1_START from the state machine 48 of FIG. 5 and begins to count for a predetermined interval. During this time, the finite state machine 48 generates the signal SMCN to initialize the scan flip-flops $16_1$-$16_k$ of FIG. 4 and to rest the non-scan portion 32 (see FIG. 2). Also, the LFSR 28 and the MISR 34 (both of FIG. 4) are reset. Typically, the LFSR 28 is first initialized first in a manner described below. Then, the chain of scan flip-flops $16_1$-$16_k$ is initialized by first setting the SMCN signal to a logic "0" and thereafter scanning a set of bits of known values by clocking the scan flip-flops S times where S is the number of scan flip-flops. Next, the non-scan portion 32 is reset by setting the signal SMCN to a logic "0" and clocking both the NTCK and STCK signals for D cycles, where D is the maximum number of non-self-looping flip-flops $14_4$-$14_n$ that any directed path can traverse from a primary input to a primary output of the non-scan portion 32 of FIG. 4. In this way, after D cycles, the non-scan flip-flops $14_4$-$14_n$ can be initialized. Lastly, the MISR 34 is initialized as described below. The total time (in terms of clock cycles) need for initialization is equal to the sum of L+S+D+M where L is the length of the LSFR 28 and M is the length of the MISR.

Figure 7:
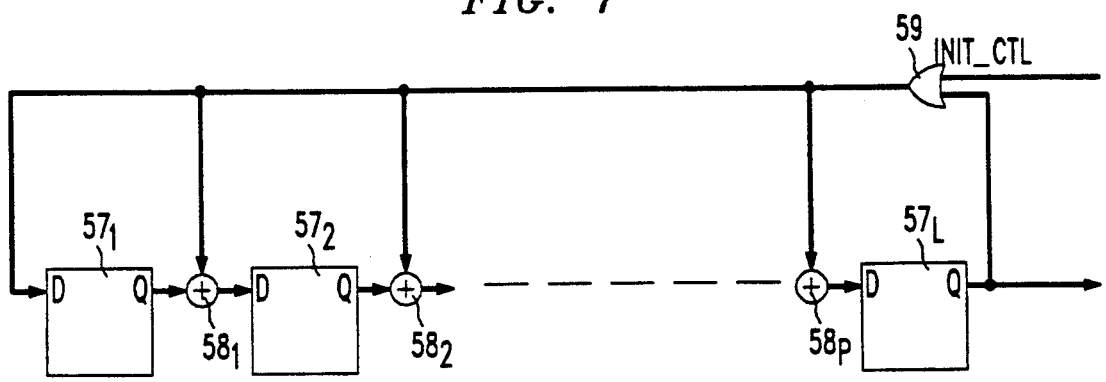
FIG. 7 is a block schematic diagram of a linear feedback shift register within the test system of FIG. 4.

While there are several possible techniques for initializing the LSFR 28 of FIG. 4, one especially efficient technique is illustrated in FIG. 7. In practice, the LSFR 28 of FIG. 7 is comprised of a chain of flip-flop $57_1$, $57_2$ ... $57_L$ (where L is an integer), the output of each one being supplied to the input of the next successive flip-flop in the chain. The output of the last flip-flop in the chain (flip-flop $57_L$) is fed back to the first flip-flop $57_1$. Each of a set of exclusive OR (XOR) gates $58_1$, $58_2$ ... $58_p$ (where p is an integer<L) exclusively OR's the output signal from the last flip-flop $57_0$ with the input signal fed to a separate selected one of the flip-flops $57_2$ ... $57_L$ from a corresponding one of the preceding flip-flops $57_1$-$57_{L-1}$, respectively. The number and arrangement of the XOR gates $58_1$-$58_p$ depends on the particular polynomial associated with the LFSR 28.

To efficiently accomplish initialization of the LFSR 28 of FIG. 7, a two-input OR gate 59 is placed in the feedback path of the LSFR such that the output of the last flip-flop $57_L$ is supplied to one of the two OR gate inputs while the output thereof is supplied to a corresponding first input of the XOR gates $58_1$-$58_p$. The second input of the OR gate 59 is supplied with a signal INIT_CTL from the controller 38 of FIG. 5. During the initialization state 56, the signal INIT_CTL is asserted and the clock signal STCK is clocked for L cycles. In this way, a set of known values will be latched into the flip-flops $57_1$-$57_L$.

Figure 8:
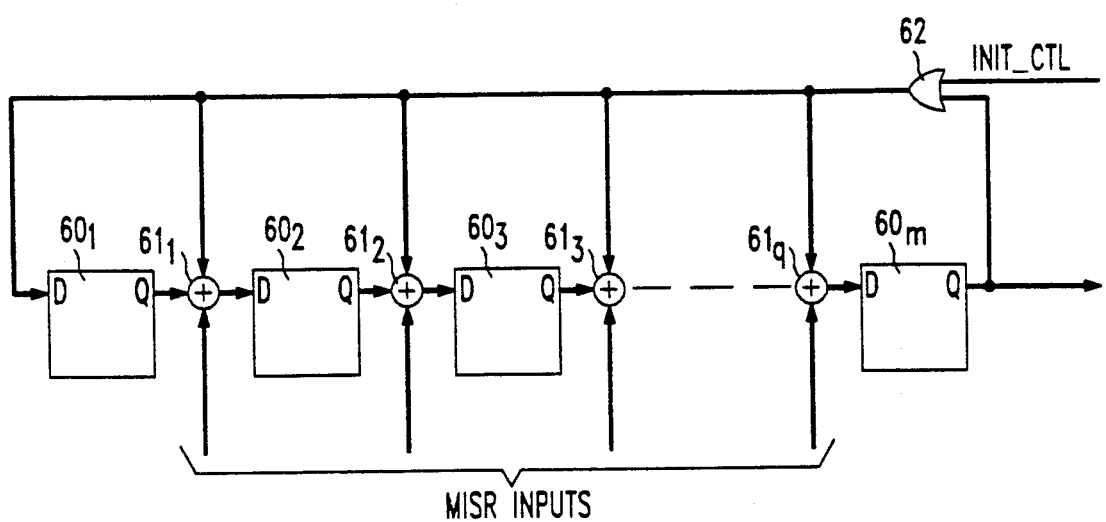
FIG. 8 is a block schematic diagram of a multiple-input shift register within the test system of FIG. 4.

Referring to FIG. 8, the MISR 34 can be initialized in essentially the same manner as the LSFR 28 of FIG. 7. As seen in FIG. 8, the MISR 34 is comprised of a chain of flip-flops $60_1$-$60_M$ (where M is an integer), the output of each one being supplied to the input of the next successive flip-flop in the chain. Each of a set of exclusive OR (XOR) gates $61_1$, $61_2$ ... $61_q$ (where q is an integer<M) exclusively OR's the output signal from the last flip-flop $60_M$ with both a corresponding one of the input signals to the MISR 34 and the input signal fed to a separate, selected one of the flip-flops $61_2$ ... $61_M$ from a preceding, corresponding one of the flip-flops $61_1$-$61_{M-1}$, respectively. The number and arrangement of the XOR gates $60_1$-$61_q$ depends on the particular polynomial associated with the MISR 34.

To enable efficient initialization of the MISR 34, a two-input OR gate 62 is provided in the feedback loop of the MISR such that the output of the last flip-flop $60_M$ is supplied to the first OR gate input while the output thereof is supplied to an input of each of the XOR gates $61_1$-$61_q$. The second input of the OR gate 62 is supplied with the INIT_CTL signal from the controller 38 of FIG. 5. During initialization, the INIT_CTL signal is asserted while the STCK signal is clocked M times to latch a known bit into a separate one of the flip-flops $60_1$-$60_M$.

Referring to FIG. 6, once the counter 54 of FIG. 5 has completed counting, the counter generates a signal C1_END which is supplied to the state machine 48 of FIG. 5, causing the machine to enter a SCAN state 62. (As may now be appreciated, the INITIALIZATION state 62 of FIG. 6 remains active for as long as the C1_END signal is not asserted, which condition is represented by the looping arrow bearing the legend C1_END above the INITIALIZATION state.) Upon entry of the scan state 62, the state machine 48 of FIG. 5 generates a signal C2_START which causes the counter 52 of FIG. 5 to commence counting. The state machine 48 remains in the SCAN state 62 of FIG. 6 during the interval that the counter 52 is counting.

While in the SCAN state, the scan flip-flops $16_1-16_k$ of FIG. 4 are clocked by the signal STCK. At the same time, the SCMN signal is asserted so that successive bits of a first test vector (comprising the signal SCAN DATA) are scanned into the scan flip-flops $16_1-16_k$. As the scan flip-flops $16_1-16_k$ are clocked, the bits previously scanned into the scan flip-flops are sequentially shifted into the MISR 34 of FIG. 4.

When the counter 52 of FIG. 5 has counted down, the counter generates a signal C2_END which causes the finite state machine 48 of FIG. 5 to enter a NORMAL state 64 depicted in FIG. 6, at which time a signal C3_START is generated to cause the counter 50 to commence counting. Thus, the state machine 48 remains in the SCAN state 62 of FIG. 6 until the signal C2_END is asserted, which condition is indicated by the looped arrow, bearing the legend C2_END alongside the SCAN state. During the NORMAL state 64, the multiplexer 31 of FIG. 4 is operative to pass a second test vector from the LFSR 28 to the non-scan portion 32 of FIG. 4. Further, the SMCN signal now is de-asserted so that each of the scan flip-flops $16_1-16_k$ of FIG. 4 now responds to a signal from the non-scan portion 32. Also at this time, the NORMAL signal is asserted, causing the clock circuit 40 of FIG. 3 to clock the non-scan portion 32 of integrated circuit 10 of FIG. 4 once with the signal NSTCK so that the bits of the second test vector are entered thereto. Upon receipt of the bits of the second test vector, the integrated circuit 10 produces a response at its primary outputs (i.e., the output of the non-scan portion 32) at the same time a bit is shifted into each of the chain of scan flip-flops $16_1-16_k$ from the non-scan portion as well. The response signal at the output of the non-scan portion 32 is compacted at the MISR 34 with the bits previously shifted out of the chain of scan flip-flops $16_1-16_k$.

The NORMAL state 64 of FIG. 6 ends when the counter 50 of FIG. 5 counts down and generates a signal C3_END, whereupon the SCAN state 62 of FIG. 6 is re-entered and the counter 52 of FIG. 5 is re-initialized by the signal C2_START. During the SCAN state 62, the scan-flip-flops $16_1-16_k$ of FIG. 4 are placed in a non-operational or "test" mode so that bits of a subsequent first test vector may be scanned therein in preparation for re-entry to the NORMAL state 60. Upon re-entry to the NORMAL state 64, the step of clocking the non-scan portion 32 of FIG. 4 to enter a subsequent second test vector is repeated.

The process of transitioning between the SCAN and NORMAL states 62 and 64, respectively, of FIG. 6 continues for an interval determined by the number of times the counter 50 of FIG. 5 has counted down. At the end of this interval, the state machine 48 of FIG. 3 transitions from the NORMAL state 64 of FIG. 6 to a WAIT state 66, whereupon the state machine 48 of FIG. 5 generates a signal BIST_DONE, which is supplied to the external test system 30 of FIG. 4 to signify completion of testing. The wait state 66 of FIG. 6 is entered and held by the state machine 48 of FIG. 5 for a set period to allow the compacted response data stored in the MISR 34 of FIG. 4 to be accessed by the external test system 30. Following access of the MISR 34 of FIG. 4, the state machine 48 of FIG. 5 enters a RESET state 68 (see FIG. 6) during which built-in self-test operations are carried out. In other words, during the RESET state 68, the integrated circuit 10 of FIG. 4 operates in its normal (non-test) mode of operation or in a conventional partial-scan mode. The state machine 48 of FIG. 5 remains in the RESET 68 state as long as the START_BIST signal is not asserted (as indicated by the looped arrow bearing the legend START_BIST above the RESET state). Once the START_BIST signal is asserted, the INITIALIZATION state 56 of FIG. 6 is entered as described previously.

In some instances, it is desirable to partially scan test the integrated circuit 10 in the traditional manner described with respect to FIG. 2 rather than carry out partial-scan testing in a built-in self-test mode in accordance with the invention. To enable partial-scan testing to be carried out without interference, the state machine 48 of FIG. 5 is responsive to an externally-generated scan control signal SCAN_CTL, which upon receipt, during the RESET state, initiates traditional partial-scan testing while causing the state machine 48 to be temporarily inhibited from changing states. During the RESET state 68, the scan flip-flops $16_1-16_k$ can be scanned independently of the test system 26 of FIG. 4.

Figure 9:
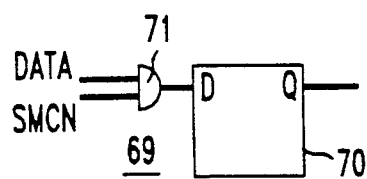
FIG. 9 is a block schematic diagram of an initializable flip-flop for replacing a self-looping non-scan flip-flop in the integrated circuit of FIG. 2.

To effectively carry out partial-scan testing of the integrated circuits 10 in a built-in self-test mode in accordance with the invention, the non-scan flip-flops $14_4-14_n$ of FIG. 2 must be brought to a known (i.e., an initial) state. As discussed, such initialization is typically carried out by the state machine 48 of FIG. 5 during the INITIALIZATION state 56 of FIG. 6. However, I have discovered that proper initialization cannot generally be accomplished very efficiently when one or more self-looping, non-scan flip-flops, such as the flip-flop $14_6$ in FIGS. 1 and 2, are present. The reason is by virtue of being self-looping, the output of the flip-flop $14_6$ appears at the flip-flop input and may alter the ability to reset the device. To overcome this problem, I have found it desirable to replace each self-looping flip-flop with an initializable flip-flop unit 69 as seen in FIG. 9. (Note that the feedback loop associated with the flip-flop $14_6$ would also be present with the initializable flip-flop unit 69 upon its substitution.)

The initializable flip-flop 69 unit comprises a conventional D-type edge-triggered flip-flop 70 whose D input is supplied with the output of an AND gate 71 supplied at each of its two inputs with a pair of signals DATA and SMCN. The DATA signal represents the normal data which would otherwise have been supplied to the flip-flop $14_6$ of FIGS. 1 and 2. The signal SMCN is generated by the controller 38 of FIG. 5 during the initialization state 56 of FIG. 6. In this way, when the SMCN signal is asserted, the signal will be logically ANDED with the DATA signal (including the feedback signal from the flip-flop output) to assure that the flip-flop $14_6$ is indeed initialized.

The foregoing describes a test system 26 and its method of use for partial-scan testing of the integrated circuit 10 in a built-in self-test mode. The advantage of the present technique is that testing of multiple integrated circuits 10 on a circuit board (not shown) can be easily carried out by the boundary scan test system 30 of FIG. 4 by simply supplying the TDI, TCK and TMS signals to each such integrated circuit in parallel with the others. Note that while the test system 26 has been described as being responsive to an START_BIST signal from the boundary scan test system 30, the START_BIST could be generated by another source.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for testing an integrated circuit containing a plurality of flip-flops, a selected group of which is arranged in a scan chain for effectuating partial-scan testing of the integrated circuit, the method comprising the steps of:
   (a) replacing each non-scan chain flip-flop which is self-looping with an initializable, non-scan flip-flop;
   (b) initializing each flip-flop to a known state;
   (c) placing the integrated circuit in a non-operational mode;
   (d) shifting a first test vector into the scan chain flip-flops while simultaneously scanning out bits previously shifted into the scan chain flip-flops;
   (e) returning the integrated circuit to a normal operating mode;
   (f) applying first and second test vectors to the integrated circuit to cause it to generate a response and cause a bit to be shifted into each of the scan chain flip-flops;
   (g) compacting the response of the integrated circuit with the bits shifted out of the scan chain flip-flops to yield a stream of bits indicative of the operation of the circuit; and
   (h) repeating steps (c)–(g) a predetermined number of times.

2. The method according to claim 1 wherein the step of shifting the first test vector includes the steps of:
   reading bits of the first test vector from a first storage register in the integrated circuit; and
   repetitively clocking the scan chain flip-flops to shift the first test vector therein.

3. The method according to claim 2 wherein the step of applying the bits of the second test vector comprises the steps of:
   reading bits of the second test vector from the first storage register; and
   clocking the non-scan chain flip-flops once.

4. The method according to claim 1 wherein the compacting step comprises the step of entering response bits from the integrated circuit, and the bits shifted out of the scan flip-flops, into a multiple input shift register within the integrated circuit.

5. The method according to claim 4 wherein the steps of initializing the integrated circuit comprises the steps of sequentially initializing the first register, the scan chain flip-flops, the non-scan chain flip-flops, and then the second register.

6. A test system for testing an integrated circuit configured of a plurality of flip-flops, at least one being self-looping and at least a portion of the flip-flops being selected as scan flip-flops and being arranged in a scan chain, to effectuate partial-scan testing of the circuit, comprising:
   an initializable flip-flop for replacing each self-looping non-scan flip-flop;
   first register means for storing first and second test vectors for input to the chain of scan flip-flops and for input to the integrated circuit, respectively;
   controller means coupled to the integrated circuit and to the first register means for: (a) initializing the integrated circuit; (b) causing the first and second test vectors from the first test register to be applied to the chain of scan flip-flops and to the integrated circuit, respectively, during a test interval; and (c) causing the chain of scan flip-flops and the integrated circuit to operate in a non-test (normal) mode following receipt of the first and second test vectors, respectively, so that the integrated circuit generates a response and causes a bit to be shifted into each respective scan chain flip-flop; and
   means coupled to the integrated circuit for compacting the response generated by the integrated circuit with the bits shifted out of the scan chain flip-flops.

7. The apparatus according to claim 6 wherein the controller means comprises:
   a clock control circuit for clocking the chain of integrated circuits and for clocking the non-scan flip-flops;
   a finite state machine for controlling the operation of the first register means, the scan chain flip-flops and the integrated circuit at preselected intervals; and
   a plurality of counters coupled to the finite state machine for signaling the occurrence each preselected interval.

8. The invention according to claim 6 wherein the first register comprises a linear feedback shift register.

9. The invention according to claim 6 wherein said means for compacting comprises a multiple input shift register.

10. The method according to claim 6 wherein each initializable flip-flop comprises:
    a D-type flip-flop having an input and an output; and
    a multiplexer for selectively supplying an initializing signal and normal data to the input of the D-type flip-flop.

11. The apparatus according to claim 6 wherein the controller is responsive to control signals from an external boundary scan test system.

* * * * *